United States Patent
Mondal et al.

(10) Patent No.: US 7,843,033 B2
(45) Date of Patent: Nov. 30, 2010

(54) SHIELDED INTEGRATED CIRCUIT PAD STRUCTURE

(75) Inventors: Jyoti P. Mondal, Palatine, IL (US); David B. Harr, Spring Grove, IL (US)

(73) Assignee: Freescale Semiconductor, Inc., Austin, TX (US)

( * ) Notice: Subject to any disclaimer, the term of this patent is extended or adjusted under 35 U.S.C. 154(b) by 150 days.

(21) Appl. No.: 12/028,650

(22) Filed: Feb. 8, 2008

(65) Prior Publication Data
US 2009/0200647 A1 Aug. 13, 2009

(51) Int. Cl.
H01L 31/00 (2006.01)
H01L 23/62 (2006.01)

(52) U.S. Cl. .......................... 257/508; 257/503; 257/25; 257/E23.179; 257/E23.192; 257/E23.34; 257/E29.042; 257/E29.341; 257/E23.002; 257/E23.052; 257/E23.194

(58) Field of Classification Search .................... 257/25, 257/E29.179, E29.192, E29.34, E29.341, 257/E29.042, 503, 508, E23.002, E23.032, 257/E23.194
See application file for complete search history.

(56) References Cited

U.S. PATENT DOCUMENTS

| | | | |
|---|---|---|---|
| 5,442,228 A | 8/1995 | Pham et al. | |
| 5,548,129 A * | 8/1996 | Kubena | 257/24 |
| 5,602,421 A | 2/1997 | Li | |
| 6,097,260 A | 8/2000 | Whybrew et al. | |
| 6,498,396 B1 | 12/2002 | Arimoto | |
| 6,720,493 B1 | 4/2004 | Strobel et al. | |
| 7,101,444 B2 * | 9/2006 | Shchukin et al. | 148/33 |
| 2001/0030588 A1 * | 10/2001 | Son et al. | 333/203 |
| 2002/0084509 A1 | 7/2002 | Ballantine et al. | |
| 2006/0145308 A1 | 7/2006 | Floyd et al. | |
| 2006/0192265 A1 | 8/2006 | Hsu | |
| 2006/0192288 A1 | 8/2006 | Ueno | |
| 2009/0039361 A1 * | 2/2009 | Li et al. | 257/94 |

FOREIGN PATENT DOCUMENTS

KR 10-2006-0047900 5/2006

OTHER PUBLICATIONS

Aktas, A., et al., Pad De-Embedding in RF CMOS; Circuits and Devices Magazine, May 2001, vol. 17, Issue 3, pp. 8-11; ISSN 8755-3996; IEEE.
PCT Application No. PCT/US2009/030512; Search Report and Written Opinion; mailed Aug. 28, 2009.

* cited by examiner

*Primary Examiner*—Long K Tran
(74) *Attorney, Agent, or Firm*—Vedder Price P.C.

(57) ABSTRACT

An integrated circuit pad structure includes a ground strip (206) positioned below a pad (101). In one example a conductive element (102) is coupled to the pad (101), and at least two tiled layers, positioned below the first conductive element (102) and positioned above the ground strip (206) are included. A conductor (203), may run beneath the ground strip (206). In a second example, a pad (101) is seated on a ground shield cage having a bottom conductive ground element (302) including several ground strips where at least one ground strip (116) is along a signal routing path. The ground shield cage further includes a set of stacked conductive ground elements, stacked to form sidewalls (209, 210) of the cage. The top conductive ground element (301) of the stacked elements has an inner perimeter and an outer perimeter, such that the inner perimeter surrounds the pad (101) and the top conductive ground element (301) is in the plane of the conductive element (102) coupled to the pad (101).

13 Claims, 7 Drawing Sheets

SIMPLIFIED SECTION "1-1"

SHIELDED INTEGRATED CIRCUIT PAD STRUCTURE

BACKGROUND

Field

The present disclosure is related to integrated circuit pads and to shielding of the pads from spurious coupling due to, for example nearby signal routing and/or parasitic reactance caused by various elements near to the pad structure.

Various types of integrated circuits (ICs) including those using various CMOS processes are prone to noise and spurious coupling due to different frequency signals routing through the circuitry of the integrated circuit. For example integrated circuits employing radio frequency (RF) circuitry that operates at a high frequency may interfere with other higher or lower frequency devices residing on the same integrated circuit. Such coupling problems may be encountered with respect to pads, such as, but not limited to, RF pads, which are connectors on the surface of an integrated circuit for connecting external circuitry thereto. An IC structure having various elements may have circuit routing directly beneath the pad or at various locations about the pad.

Circuit routing passing near the pad, which may be connected to any type of device, may be interfered with by the device connection or vice versa, the connection and the external device may be interfered with by spurious signals emanating from the signal routing passing near the pad on the integrated circuit.

Likewise circuitry may be routed underneath the pad connection which may also result in the external device interfering with, or receiving interference from, the circuit routing. Existing systems try to accommodate routing of signals underneath a pad by providing a ground shield. Typically the ground shield is a conducting plate at one of the IC substrate layers beneath the pad and between the pad and the circuit routing. This however creates an additional problem in that the plate of the shield pad creates parasitic capacitance, or other undesirable reactance, between the plate and the routing conductor or between the plate and the pad itself. Further, other undesirable reactance can be obtained from lateral routing as well. Thus although the ground shield plate protects from unwanted interference between the pad connection and various circuit routing, it itself creates a problem with respect to parasitic capacitance.

DETAILED DESCRIPTION

Briefly, an integrated circuit includes a pad and a ground strip element including a set of ground strips positioned below the pad. The integrated circuit further includes a first conductive element coupled to the pad, and at least two tiled layers, positioned below the first conductive element and positioned above the ground strip element. A conductor rout including at least one conductor, may run beneath, and parallel to, one ground strip of the set of ground strips. Among other advantages, in one example an integrated circuit pad structure provides isolation from spurious signal coupling and reduces parasitic reactance due to ground shielding. Another example is an integrated circuit including a pad positioned in a ground shield cage. The ground shield cage has a bottom conductive ground element including a set of ground strips where at least one ground strip of the set is along a signal routing path of the integrated circuit. The ground shield cage further includes a set of stacked conductive ground elements that define sidewalls of the cage. The top conductive ground element has an inner perimeter and an outer perimeter, such that the inner perimeter surrounds the pad. Each conductive ground element of the stacked conductive ground elements has a top surface area substantially determined by a difference between a first area determined by the outer perimeter and a second area determined by the inner perimeter. Each conductive ground element of the set of conductive ground elements is electrically coupled to another of the ground elements, and the top conductive ground element is in the plane of a conductive element coupled to the pad.

Figure 1:
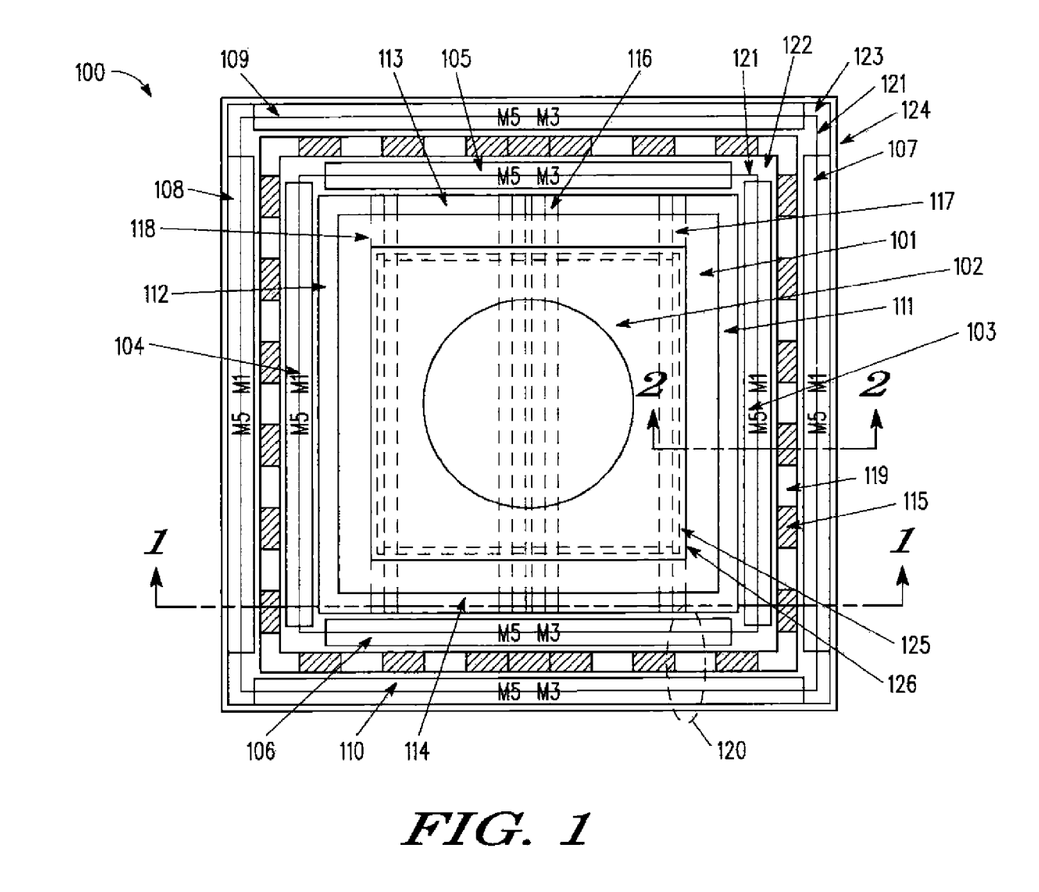
FIG. 1 is a top view of a pad structure on an integrated circuit in accordance with an embodiment.
Figure 2:
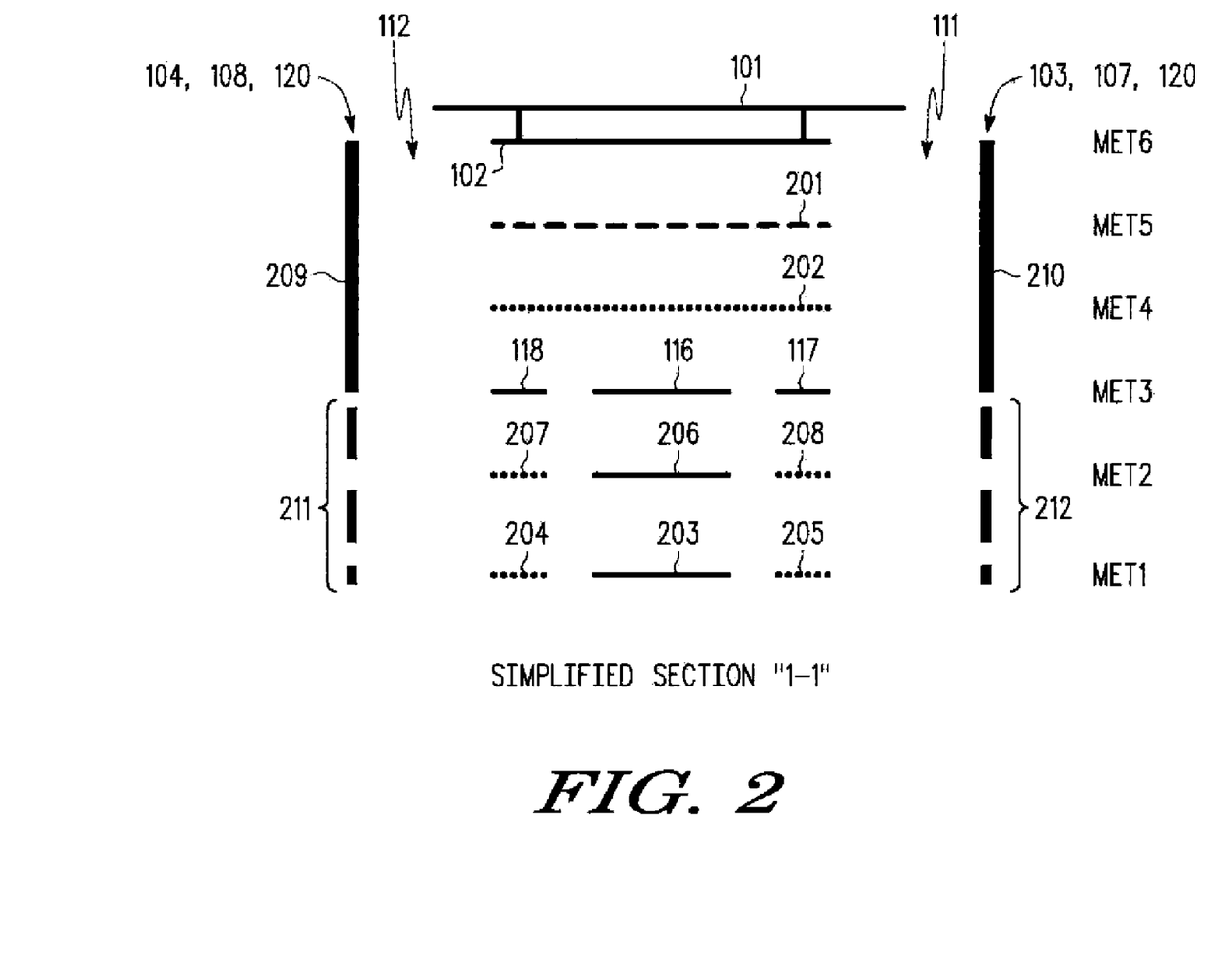
FIG. 2 provides a simplified cross-sectional view of the top view illustrated in FIG. 1 in accordance with the embodiments.

Turning now to the drawings where like numerals represent like components, FIG. 1 and FIG. 2 are a top view and cross sectional view respectively, of a pad structure 100 in accordance with the embodiments. In FIG. 1, a pad 101 which may be an aluminum pad or any other suitable material pad, is positioned in a ground shield cage. The ground shield cage top conductive ground element has a top surface 120 and is made up of several members including right outer member 107, left outer member 108, top outer member 109, bottom outer member 110, and right inner member 103, left inner member 104, top inner member 105, and bottom inner member 106. These members form inner and outer walls of the overall sidewalls of the ground shield cage and are electrically coupled by connections 121.

The various layers may utilize more or less members for constructing the shield cage top conductive ground elements as well as the other conductive ground elements that make up the ground shield cage. For example, the top conductive ground element has the inner members 103, 104, 105 and 106 and outer members 107, 108, 109 and 110 as shown, while a lower conductive ground element has a continuous inner square portion 122 and a continuous outer square portion 123 which appear around and below the top conductive ground element in FIG. 1. In another example, a conductive ground element may have several members per side, or may have a single member per side. Other embodiments having varying numbers of members for constructing the ground shield cage conductive ground elements are therefore contemplated by the present disclosure.

Further, although not completely visible in FIG. 1, the ground shield cage is constructed as a set of stacked conductive ground elements. In the example illustrated in FIG. 1, the stacked conductive ground elements are relatively equal in width and therefore, only the top conductive ground element and the conductive ground element formed by inner square portion 122 and outer square portion 123, are visible from the top view. However, in other embodiments the top and/or other conductive ground elements may have other varying widths, which may be staggered at various layers. For example, in FIG. 1 an edge 124 of a lower layer conductive ground element below the top conductive ground element (and also below the conductive ground element formed by inner square portion 122 and outer square portion 123) can also be seen in the top view of FIG. 1.

It is to be understood that the relational terms "left," "right," "top," "bottom," etc. are only used herein with respect to the orientation of the Figures and for the purpose of describing the embodiments illustrated thereby. Thus the relational terms are not to be construed as any limitation on the orientation with respect to the embodiments for any of the items described in the Figures. In accordance with the various embodiments disclosed herein, any desired orientation of the pad or corresponding pad structure may be used on an integrated circuit.

It can been seen that gaps are present between the various inner members and the perimeter of the pad 101. For example, right gap 111 exists between right inner member 103 and the pad 101 Likewise, there is atop gap 113, left gap 112, and bottom gap 114 between the corresponding top, left and bottom inner members, respectively, and the edges of the pad 101 perimeter. Therefore, the ground shield cage inner members surround the perimeter of the pad 101.

Further, the various outer and inner members that include the ground shield cage top conductive ground element are electrically coupled by connections 115. As can be seen in FIG. 1, small gaps 119 remain present between the various connections 115. However, as was discussed previously, the inner and outer members may not be present in other embodiments and instead a solid single member may be used such that no connections 115, and/or connections 121 are necessary.

Therefore, in accordance with the embodiment illustrated by FIG. 1, the top conductive ground element has a surface area substantially determined by the difference in surface areas of the outer square area (formed by the outside perimeter of the outer members right 107, left 1 08, top 109 and bottom 110) and the inner square area (formed by the inner perimeter of the inner members; right 103, left 104, top 105, and bottom 106). For example, the gaps 118 between the connections 115, may be neglected in the determination of the top ground conductor element surface area. However, the top surface may be solid in some embodiments as discussed above. A bottom ground conductor element is also present (not shown in FIG. 1) which includes a center ground strip 116, and two side ground strips 117 and 118. FIG. 2 provides a simplified cross sectional view of the pad structure and ground shield cage shown in the top view of FIG. 1. The cross-section is simplified in that it does not show the various conductive ground elements that make up the ground shield cage. For simplicity and to facilitate describing the general structure, a ground shield cage left sidewall 209 and right sidewall 210 are illustrated. The top surfaces of the left inner member 104 and left outer member 108 correspond to the top surface of the left sidewall 209, while the top surfaces of the right inner member 103 and right outer member 107 correspond to the top surface of right sidewall 210. Therefore, the sidewalls may be formed by inner and outer members such that a sidewall may consist of an inner wall and an outer wall.

In another example, the sidewall may consist of an inner wall, an outer wall, and one or more intermediate walls between the inner wall and the outer wall.

The simplified cross-sectional view of the embodiment illustrated by FIG. 2 is labeled with respect to "6-1 MT" CMOS technology by the metal layer labels located on the right side of the drawing, for example "MET1" through "MET6." However, any appropriate technology may be used in accordance with the embodiments and the ground shield cage structure may be modified to accommodate any desirable technology.

The pad 101 being positioned in the ground shield cage, for example, sits on top of a conductive metal element 102, which corresponds to metal layer 6 or "MET6" in the 6-1 MT CMOS technology. The ground shield cage sidewalls 209, 210 begin in the plane of MET6 and continue downwards until MET1. For most embodiments, the sidewalls 209, 210 will terminate at MET3 as will be discussed further, however the sidewalls that run parallel to a conductor routing may be continued to the level of the conductor layer to provide additional shielding such as left sidewall extension 211 and right sidewall extension 212, to shield against coupling from lateral signal routings.

The surface 120 of the ground shield cage sidewalls 209, 210 are in the plane of the conductive element 102 at MET6. Below the conductive element 102 are two tiling layers 201 and 202 shown at MET5 and MET4. respectively. The metal tiling is required in order to provide a metal density required for mechanical stability of the IC structure.

Because the tiling material is metal, the tiling may also be a source of undesired reactance between various circuit elements. The various embodiments herein disclosed take the tiling material into account in determining a ground pattern for reducing overall parasitic reactance. As shown, the tiling material of tiling layers 201 and 202 does not extend into the gaps, right gap 111 and left gap 112, between the sidewalls 209, 210 and the conductive element 102.

The ground strips 116, 117 and 118 are shown located at MET3. Below the center ground strip 116 is a signal routing conductor 203 at MET1, which was not visible from the top view of FIG. 1. MET2 element 206 is a tiling element, as are tiling elements 207 and 208, however element 206 may also be a signal routing element in some embodiments. In other words, either one or both of MET1 and MET2 may be used as a conductor routing layer. At MET1, elements 204 and 205 are tiling, however, elements 204 and 205 may also be additional routing conductors in some embodiments.

It is to be understood that FIG. 2 does not illustrate electrostatic discharge protection elements however, in some embodiments, electrostatic discharge protection may be added in addition to the elements shown in FIG. 2. The pad as shown in FIG. 2 if used for an RF application may not need electrostatic discharge protection. For example, VCO pads, transmission outputs or other outputs that are not directly routed to module pins or not connected to active devices may not need electrostatic discharge protection. However, it is to be understood that the various embodiments herein disclosed are applicable to those applications using electrostatic discharge protection as well as applications not needing electrostatic discharge protection.

Returning now to FIG. 2 and with respect to ground strips 116, 117 and 118, it can be seen that the set of ground strips is different from prior systems which used a continuous grounding plate underneath the pad 101. Therefore, for the embodiments, the parasitic capacitive coupling between the ground strips 116, 117 and 118, and the pad 101 and the conductive element 102 is reduced over prior art systems.

Figure 3:
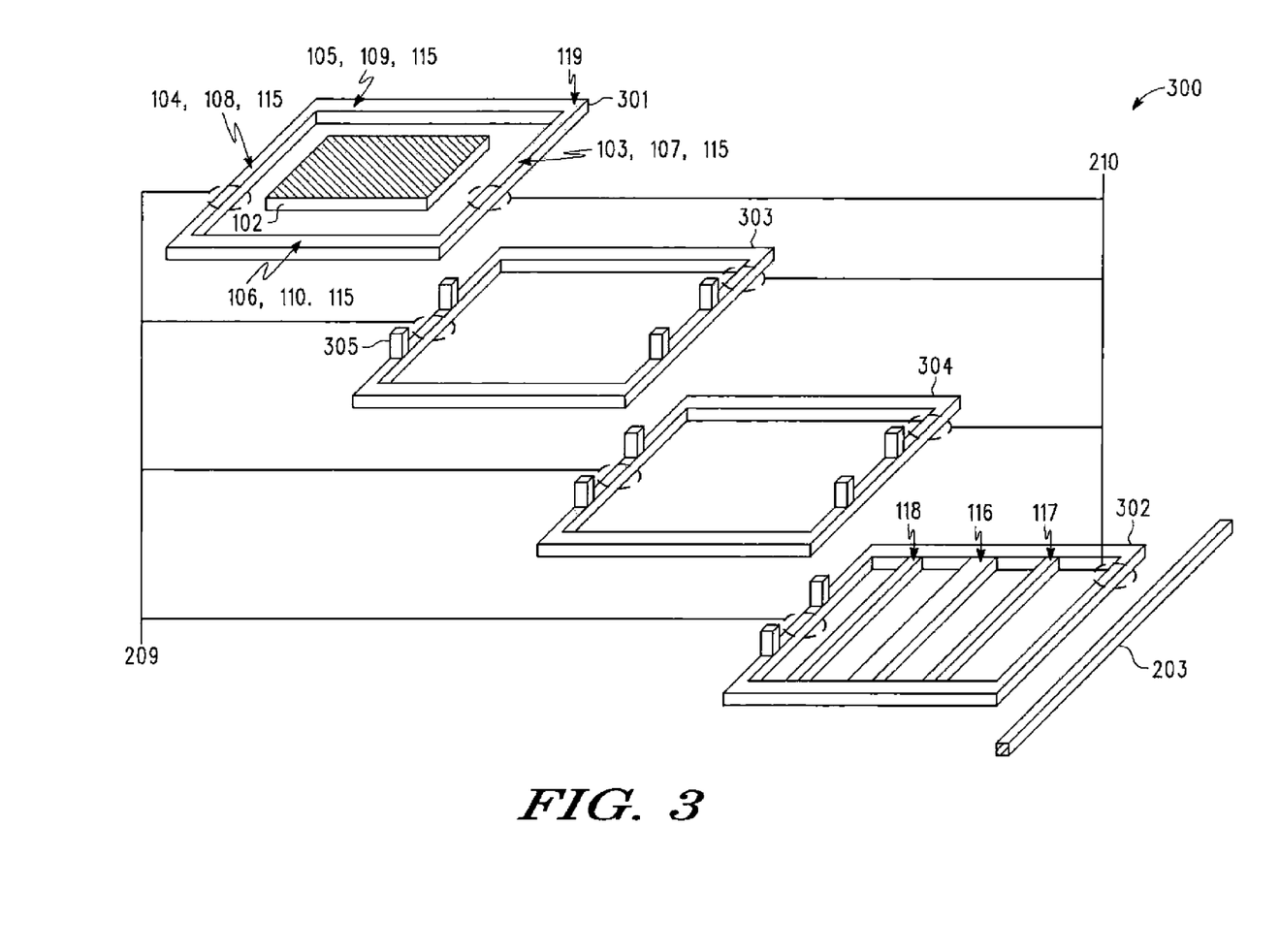
FIG. 3 is an isometric and assembly view of a ground shield cage illustrated in FIGS. 1 and 2 and in accordance with the embodiments.

FIG. 3 is an isometric and assembly view of the ground shield cage 300. The ground shield cage 300 includes a top conductive ground element 301 a bottom conductive element 302 and in some embodiments a second conductive element 303 and a third conductive element 304. Similar to the cross-sectional view of FIG. 2, the isometric view of FIG. 3 is simplified in that the various members that make up the left, right, top and bottom of the conductive ground elements are shown as a single member for simplicity of description. For example, the top side of top conductive ground element 301 is actually included of top inner member 105, top outer member 109 and connections 115 as was illustrated in FIG. 1.

Conductor 203 may be positioned under center ground strip 116. The bottom ground conductive element 302 includes the set of ground strips 116, 117 and 118 and are also visible in the top view of FIG. 1 and the cross-section view of FIG. 2. For the embodiment illustrated in FIG. 3, the side ground strips 117 and 118 have equal width. However, the ground strip width of each of the side ground strips 117 and 118 is less than the width of center ground strip 116. In this example the side ground strips 117 and 118 are half the width of the center ground strip 116. Any suitable width may be used, for example ground strip 116 may be equal in width, or greater in width, than the side ground strips 117 and 118 or other ground strips. Also ground strip 116 may be equal in width, or greater in width than conductor 203 in some embodiments.

Conductor 203 runs underneath center ground strip 116 for example and is positioned to be substantially parallel and substantially underneath ground strip 116. For example the conductor routing may not be fully covered by the ground strip if viewed from the top and may extend slightly outside an edge of the ground strip 116 as viewed from the top. In another example, the conductor may be routed with a small angle with respect to the ground strip 116 thereby being only substantially parallel ground strip 116.

The width of conductor 203 is determined by the current carrying requirements of conductor 203. If conductor 203 is designed to run underneath center ground strip 116, then the width of center ground strip 116 may be designed to correspond to the width of conductor 203 so that center ground strip 116 at least covers or overlaps the width of conductor 203. This is useful for reducing parasitic capacitive coupling between conductor 203 and other elements such as the conductive element 102 which is located in the IC structure above conductor 203. In another example, conductors may run under any of the ground strips, for example, conductors may run under ground strip 117 and/or ground strip 118. Further, any of the ground strips may be designed such that a ground strip width is at least equal to a conductor width of the conductor running underneath the particular ground strip.

However as noted above, in some embodiments ground shield strip 116 may not completely cover conductor 203. Likewise additional signal routing conductors may be present. For example, a signal routing conductor may be routed under either or both of the side ground strips 117 and 118. It is to be noted that if the conductor 203 is routed lateral to the ground shield cage as shown in FIG. 3, then shielding from lateral coupling will be provided by the sidewalls, for example left sidewall 209 and right sidewall 210, formed by the ground shield cage ground conductive elements 301, 302, 303 and 304.

Also illustrated by the isometric view of FIG. 3, is that the MET6 conductive element 102 is parallel to, and at the same layer level as, the top ground conductive element 301. As can be seen in FIG. 3 the conductive ground elements 301, 302, 303 and 304 are designed substantially square with an inner perimeter of conductive ground element 301 surrounding the conductive element 102. Although for the embodiment illustrated by FIG. 3 the conductive ground elements 301, 302, 303 and 304 are shown as squares, the conductive ground elements forming the ground shield cage 300 or any other conductors may have any suitable geometry, suitable with respect to the type of shielding or the type of circuitry required to be shielded. Therefore the geometry of the conductive ground elements 301, 302, 303 and 304 may be any suitable geometry for example rectangular, circular, hexagonal, etc.

Using top conductive ground element 301 as an example, the conductive ground elements 301, 302, 303, 304 forming the ground shield cage 300 will have an inner perimeter and an outer perimeter. Therefore the top surface area 120 of the conductive ground elements 301, 302, 303, 304 is substantially determined by the area determined by the outer perimeter minus the area determined by the inner perimeter.

Therefore for example the pad 101 illustrated in FIGS. 1 and 2 may be a circular shape and the corresponding conductive ground elements such as conductive ground element 301 may likewise be a circular shape. Further it is to be understood that the surface area of the conductive ground element such as conductive ground element 301 being determined by an outer perimeter and an inner perimeter may have an area substantially determined by the difference between the area determined by the outer perimeter and the area determined by the inner perimeter. That is, as was discussed with respect to connections 115 and gaps 119, the conductive ground element 301 may not necessarily be a solid continuous metal conductor as illustrated in the simplified view of FIG. 3. Returning now to FIG. 3, the conductive ground element such as conductive ground elements 301, 302, 303 and 304 are electrically connected to each other by various vias 305.

Figure 4:
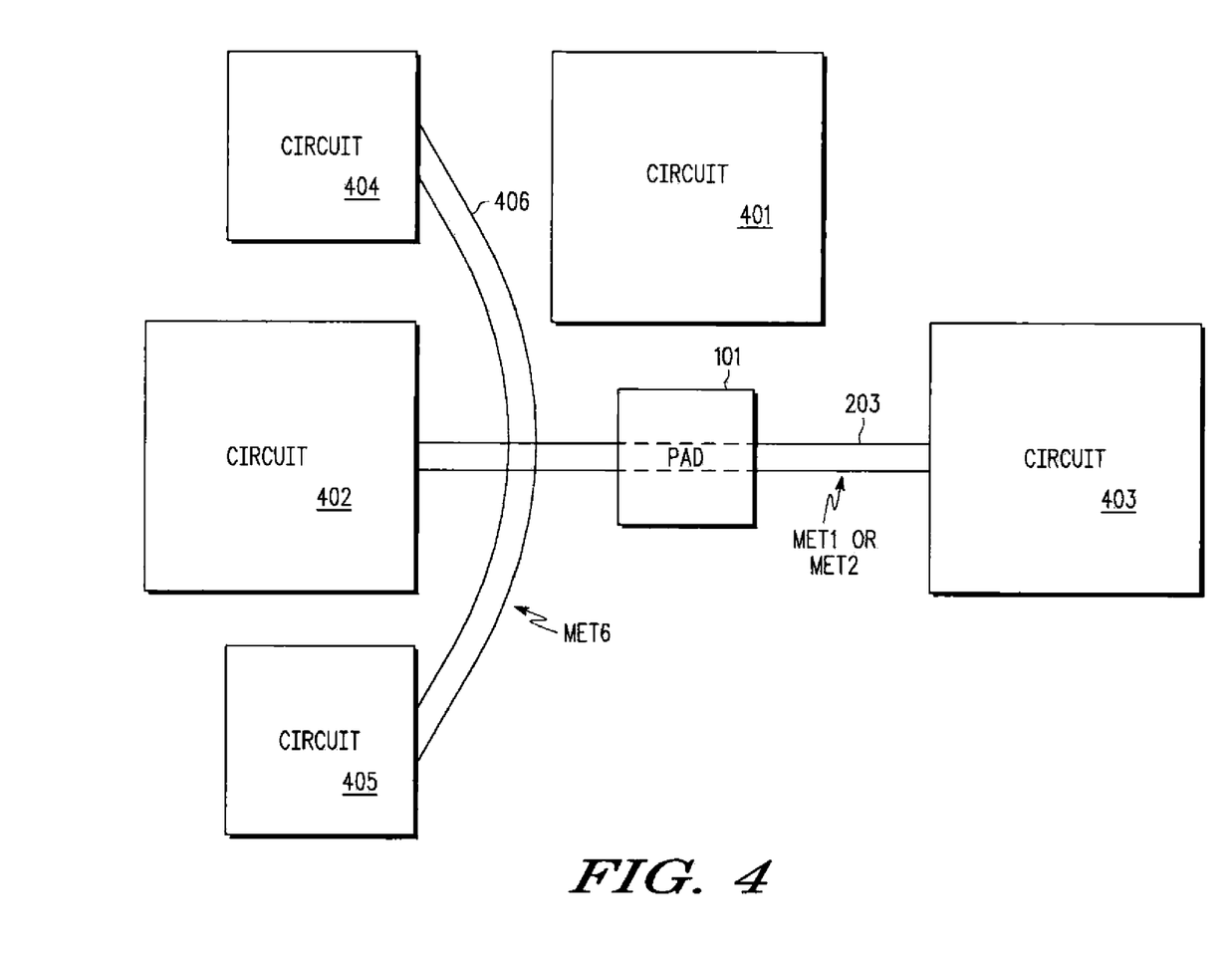
FIG. 4 is a top view of an integrated circuit layout using the pad structure of the embodiments.

Turning now to FIG. 4, a top view of an IC using the pad structure of the herein disclosed embodiments is illustrated. The pad 101 may be surrounded by various circuits such as circuit 401, circuit 402, circuit 403 and circuits 404 and 405. The conductor 203 runs underneath pad 101 and connects circuit 402 to circuit 403. The ground shield cage and ground strips of the embodiments protects any device connected via pad 101 from spurious coupling due to the conductor 203, and likewise protects the conductor 203 from noise from any connected device.

Circuits 404 and 405 are connected by lateral conductor 406 which runs substantially parallel to pad 101. Circuit 401 is not connected to any of the other circuits illustrated. Here turning briefly to FIG. 2 the ground shield cage sidewalls, such as sidewalls 209 and 210, protect the pad 101 from coupling due to lateral conductor 406.

Figure 5:
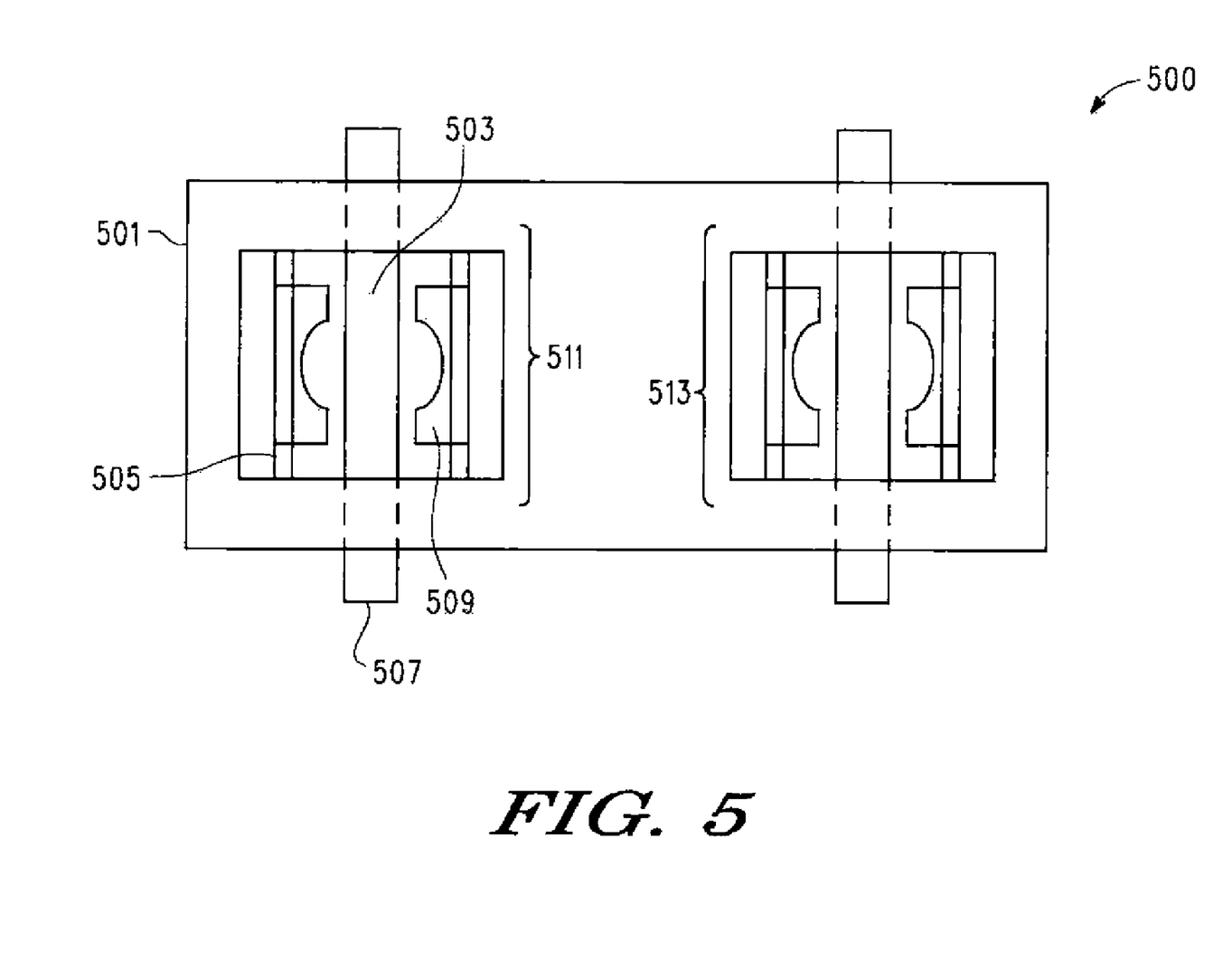
FIG. 5 is a top view layout of an integrated circuit employing the pad structure of the various embodiments for applications such as differential circuits using low noise amplifiers (LNA) or voltage control oscillators (VCO).

Turning now to FIG. 5 a differential pair of pads 500 is illustrated having a first pad structure 511 and a second paid structure 513 that are similar to the pad structure 100 illustrated in FIG. 1. The differential pair of pads 500 are useful for applications such as connections of the IC to VCOs. The pads need to be balanced. Signal routing near one pad can unbalance the pair due to parasitic coupling. Therefore the ground shield ring 501 protects the pads from parasitic coupling between each other and also from conductor routings outside the structure and lateral thereto.

For embodiments employing the 6-1 MT CMOS technology the ground width needed to provide adequate isolation between the pad and lateral signals was found to be about 20 µm. Therefore the distance between the inner perimeter and outer perimeter of the shield ring 501 in the embodiment illustrated by FIG. 5 is about 20 µm. The center ground strip 503 for the embodiment illustrated by FIG. 5 is about 15 µm in width while the two side ground strips such as ground strip 505 are about 7.5 µm in width, half of the width of center ground strip 503. For the embodiment illustrated in FIG. 5 the center ground strip 503 is as wide as the routing conductor 507 to provide adequate isolation greater than 35 dB between the pad structure 511 and the routed signal on routing conductor 507. The ground pattern provided by the three ground strips on MET3 will keep the ground parasitic within acceptable limits of less than 0.15 pF and well-defined. Further in the embodiments, the parasitic will not change with any routing or tiling imbalance near the pads. The ground strips are connected to the ground shield cage 501 at MET3. The tiling elements 509 are at metal layers 4 and 5 (MET4 and MET5) and must provide a tiling density of 40%. The various technology such as CMOS90 processes have to maintain a certain tiling density percentage on each layer for planarity of the substrate as well as thermal mechanical reasons as was previously discussed briefly. The tiling such as tiling 509 introduces a sea of unconnected metals on each layer. These unconnected metal tiles may produce uncertain parasitic reactances as was also previously discussed.

In addition, routing of the signals under the pads such as routing conductor 507 also causes unacceptable coupling. Therefore for an application such as VCO connections to integrated circuits the differential pad structure 500 illustrated by FIG. 5 reduces the parasitic coupling between the routing conductor 507 and also any lateral conductors that may pass next to the ground shield ring 501. It is to be understood that the ground strips such as ground strip 503 and ground strip 505 may be positioned in any suitable direction for routing underneath the pad structure. For example in FIG. 5 the ground strip 503 and ground strip 505 are shown routed in a vertical direction with respect to the differential pad structure 500 and the orientation of FIG. 5. However the ground strip 503 and ground strips 505 may also be routed in a position horizontal with respect to the position of a differential pads 500 illustrated in FIG. 5.

Various other embodiments are possible. For example the ground strips 116, 117 and 118 illustrated in FIG. 3 may be used without the conductive ground elements 301, 302, 303 and 304, to protect a pad merely from routing underneath, such as routing underneath by conductor 203 illustrated in FIG. 3. Likewise for pad structures not having an underneath signal routing but having only lateral routing the ground shield cage structure 300 including conductive ground elements 301, 302, 303 and 304 may be used without ground strips 116, 117 and 118 to protect the pad from lateral routing in cases where no routing is needed underneath the pad structure. However, the ground strips may still be included even if there is no signal routing underneath the pad structure.

Figure 6:
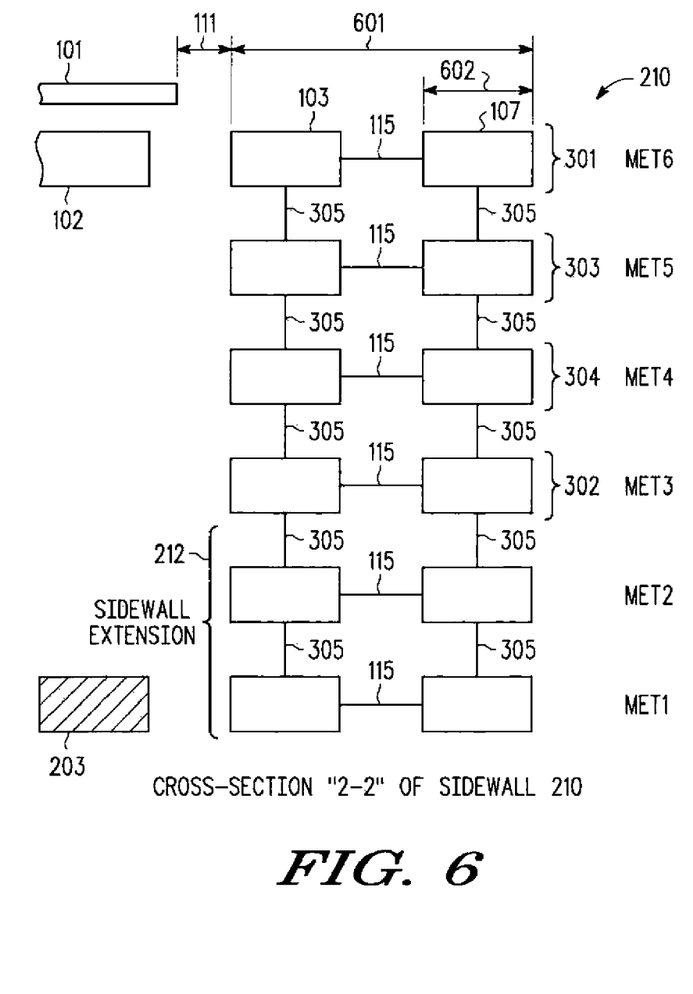
FIG. 6 illustrates a CMOS process stack used in accordance with the embodiments and in particular for CMOS90, CMOS65 and CMOS45 processes and with respect to such processes used in accordance with the embodiments.

FIG. 6 is a cross-sectional view that provides further details of right sidewall 210 and its relative position to the pad 101. In FIG. 6 the right sidewall 210 is shown constructed of several layers of metal conductors forming the conductive ground elements 301, 302, 303 and 304. The top conductive ground element 301 as shown includes the right inner member 103 and the right outer member 107 which are electrically coupled by horizontal connections 115. The various layers are connected vertically be via 305. The horizontal connections 115 between the right inner members, for example inner member 103 and right outer members, such as outer member 107, are shown as a single line for simplicity and for facilitating understanding of the cross-sectional view. However the thickness of connections 115 may be equal to the thickness of the inner member 103 and the outer member 107. Likewise the via 305 are shown as a single line for simplicity however the via 305 will have thickness greater than that shown in the cross-sectional view of FIG. 6. In FIG. 6 the conductive element 102 is shown in the same plane of the conductive ground element 301, that is, at the MET6 layer. The gap 111 represents the distance between the pad 101 perimeter and the first conductive ground element 301 which forms the top of the sidewall 210.

The overall wall width 601 in the embodiment exemplified by FIG. 6 is equal for all the conductive ground elements 301, 302, 303, 304 and sidewall extensions 212. However, in some embodiments the widths of any of the conductive ground elements 301, 302, 303, 304 and sidewall extensions 212 may vary and may also be staggered. For example, the widths of conductive ground element 301, 302 and 303 may be equal, while the width of conductive ground element 304 may be slightly wider or slightly narrower. Any combination of widths is possible for the various embodiments as may be required by the process requirements of the technology employed such as, but not limited to, 6-1 MT CMOS, etc. Likewise, for embodiments where the sidewalls are constructed of two or more members as is shown in the example provided by FIG. 6, the member widths 602 may also vary among layers and in some embodiments may also vary between members of the same conductive ground element at any particular layer.

As was previously discussed the sidewall may be extended down to the conductive layer MET1 by sidewall extensions 212 as shown. Here the conductor 203 is shown in FIG. 6 for reference but is not necessarily to scale with respect to its position from the sidewall 210. The conductor 203 in the example of FIG. 6 runs in parallel with the sidewall extensions 212 and is thereby shielded from undesirable nearby lateral signal coupling.

Also shown in FIG. 6 are the stacked conductive ground elements 301, 302, 303 and 304 that form sidewalls surrounding the perimeter of the pad 101. It is to be understood that various technologies may be employed for construction of the sidewalls and the conductive ground shield cage and various thicknesses of metal may be used in the integrated circuit construction. For example the MET1 layer used for the conductor 203 may have a thickness of approximately 1800 angstroms or less. The bottom conductive ground element 302 at MET3 may have a thickness less than 5700 angstroms and the top conductive ground element 301 at layer MET6 may have a similar thickness to the MET3 layer ground conductive element 302. Any suitable thickness of ground conductor elements or any other element may be used and remain in accordance with the embodiments.

Figure 7:
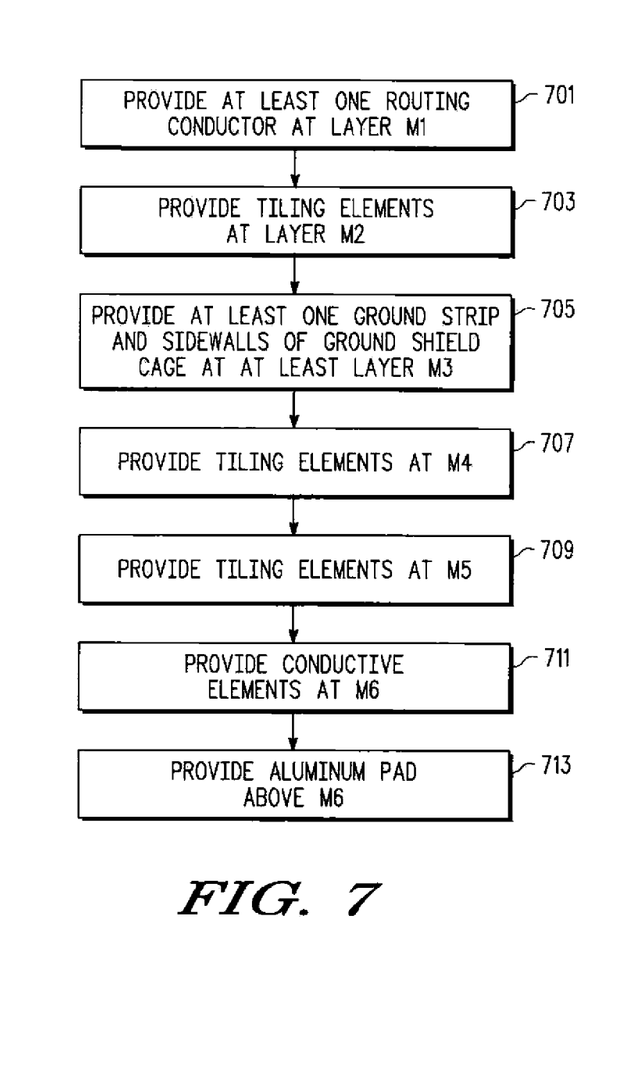
FIG. 7 is a flow chart illustrating a method of fabrication of an integrated circuit having a pad structure in accordance with the embodiments.

FIG. 7 is a flow chart providing a method of fabrication of a ground shield cage structure in accordance with the embodiments. Therefore, FIG. 7 can best be understood with respect to FIG. 2 and FIG. 6. Thus in 701 a first routing conductor layer M1 is provided using IC fabrication techniques as understood by one of ordinary skill. The metal 1 layer is provided as a routing conductor such as routing conductor 23. In some embodiments the ground shield cage structure sidewalls will extend down to the conductor layer metal layer 1 and run parallel to the routing conductor 203. Therefore in some embodiments the fabrication process will include sidewalls of the ground shield cage running along metal layer 1 in parallel. Next metal layer 2 is provided as a tiling layer in addition for the embodiments having the ground shield conductor running in parallel to routing conductor 203, a lateral wall of the ground shield cage will also be provided in parallel with the tiling layer 206, 207 and 208 at metal layer 2. Next in 705 the 3 ground strips 116, 117 and 118 are provided as well as the sidewalls of the ground shield cage at metal layer 3. In 707 and 709 the tiling layers 201 and 202 are provided. Next the top conductive element 301 is provided at metal 6 in 711. Lastly in 713 the aluminum pad 101 is provided.

Therefore various structures of integrated circuits have been disclosed in particular integrated circuits having a pad structure having routing conductor shielding underneath the pad provided by ground shield strips and/or protection from lateral conductor routing provided by a ground shield cage surrounding the perimeter of the pad and having various geometries corresponding to the pad structure. For example, for square pad structures a ground shield cage may have a substantially square geometry with an inner perimeter surrounding the perimeter of the pad. Furthermore various other geometries may be used where appropriate to accommodate various geometries of pads. For example, a round pad may have a circular ground shield cage structure with an inner perimeter surrounding the circular perimeter of the pad. Likewise various other geometries are possible as are various positionings of those geometries with respect to the pad. For example a square pad may have a rectangular shaped ground shield cage with a perimeter offset from the position of the square pad. Therefore, for example, the spacing gaps between conductive members of a ground shield cage may be a smaller distance from one end of the pad and a longer distance from another end of the pad where the ground shield cage is, for example, a rectangular shape. Further the surface area of the ground shield cage conductor may be formed by various elements including concentric circular pieces, correspondingly larger square or rectangular pieces surrounding the inner parameters of each other and connected by conductors running horizontally and/or vertically across the surface of the substrate. Various other geometries are possible as would be understood by one of ordinary skill, for example a square ground shield cage structure may have chamfered corners internally or externally to the ground shield cage for various electrical, mechanical or other design purposes.

What is claimed is:

1. An integrated circuit comprising:
    a pad;
    a ground strip element comprising a set of ground strips, positioned below said pad;
    a first conductive element coupled to said pad; and
    at least two tiled layers, positioned below said first conductive element and positioned above said ground strip element.

2. The integrated circuit of claim 1, further comprising:
    at least one conductor routed substantially beneath, and parallel to, a ground strip of said set of ground strips.

3. The integrated circuit of claim 2, wherein a ground strip width of said ground strip of said set of ground strips is at least equal to a conductor width of said at least one conductor.

4. The integrated circuit of claim 1, wherein said set of ground strips comprises three ground strips.

5. The integrated circuit of claim 4, wherein two of said three ground strips have an equal width and a third ground strip of said three ground strips has a width larger than that of said two ground strips.

6. An integrated circuit comprising:
    a pad positioned in a ground shield cage, said ground shield cage having a bottom conductive ground element comprising a set of ground strips, at least one ground strip of said set of ground strips being along a signal routing path of said integrated circuit.

7. The integrated circuit of claim 6, wherein said ground shield cage further comprises:
    a set of stacked conductive ground elements forming sidewalls.

8. The integrated circuit of claim 7, wherein said sidewalls of said ground shield cage are comprised of at least an inner wall and an outer wall wherein said inner wall is electrically coupled to said outer wall.

9. The integrated circuit of claim 8, further comprising a set of vias for electrically coupling each conductive ground element of said set of stacked conductive ground elements to a lower conductive ground element of said set of stacked conductive ground elements.

10. The integrated circuit of claim 8, further comprising:
    a conductive element electrically coupled to said pad;
    at least two tiled layers, positioned below said conductive element;
    said bottom conductive ground element positioned below said at least two tiled layers; and
    a conductor routing layer comprising at least one conductor having a conductor routed beneath, and parallel to, a ground strip of said set of ground strips.

11. The integrated circuit of claim 10, wherein said ground shield cage further comprises:
    a second ground element below a top ground element and a third ground element below said second ground element, said second and third ground elements being positioned respectively parallel to a corresponding tiled layer of said at least two tiled layers.

12. The integrated circuit of claim 11, wherein said set of stacked conductive ground elements further comprises:
    a fifth ground element, positioned parallel to said at least one conductor running along said signal routing path.

13. The integrated circuit of claim 7, wherein each sidewall of said sidewalls of said ground shield cage is comprised of a single wall.

* * * * *